United States Patent [19]

Isobe et al.

[11] Patent Number: 4,563,593
[45] Date of Patent: Jan. 7, 1986

[54] TRANSITION DETECTOR CIRCUIT

[75] Inventors: Mitsuo Isobe, Yokohama; Takayuki Ohtani, Tokyo, both of Japan

[73] Assignee: Tokyo Shibaura Denki Kabushiki Kaisha, Kawasaki, Japan

[21] Appl. No.: 538,277

[22] Filed: Oct. 3, 1983

[30] Foreign Application Priority Data

Oct. 4, 1982 [JP] Japan ................................ 57-174150

[51] Int. Cl.$^4$ ........................................... H03K 5/153
[52] U.S. Cl. .................................... 307/231; 307/517; 328/114; 328/132
[58] Field of Search ............... 307/231, 517, 518, 363, 307/265, 269; 328/114, 132

[56] References Cited

U.S. PATENT DOCUMENTS

| | | | |
|---|---|---|---|
| 3,678,295 | 7/1972 | Heneghan | 307/517 |
| 3,805,170 | 4/1974 | Dusheck, Jr. | 328/132 |
| 3,942,037 | 3/1976 | Mensch, Jr. | 307/518 |
| 4,039,858 | 8/1977 | Stewart | 307/231 |

Primary Examiner—John Zazworsky
Attorney, Agent, or Firm—Schwartz, Jeffery, Schwaab, Mack, Blumenthal & Evans

[57] ABSTRACT

A transition detector circuit comprises a first invertor train comprising 2n stages of invertors (n: positive integer including zero), the input thereof being connected to a signal input terminal while the output thereof is connected to an in-phase output terminal, a second invertor train comprising 2n+1 stages of invertors, the input thereof being connected to the signal input terminal, while the output thereof is connected to an anti-phase output terminal, a third invertor train comprising at least one stage of an invertor, which is connected to the output of the first invertor train, a fourth invertor train, comprising at least one stage of an invertor, which is connected to the output of the second invertor train, and a fifth invertor train comprising at least one stage of an invertor, which is connected to the signal input terminal. The transition detector circuit further comprises a first switching circuit which turns on or off in response to a signal fed from the third invertor train to produce a pulse signal having a first delay time determined by the first and third invertor trains, and a second switching circuit which turns on or off in response to a signal fed from the fourth invertor train and turns off or on in response to a signal fed from the fifth invertor train to produce a pulse signal having a second delay time determined by the second, fourth and fifth invertor trains.

3 Claims, 7 Drawing Figures

FIG. I
PRIOR ART
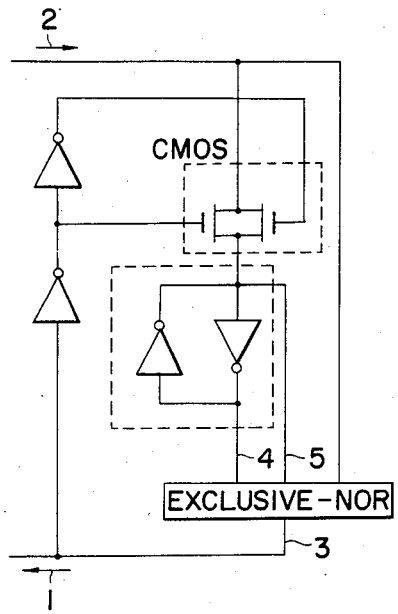
FIG. 2
PRIOR ART
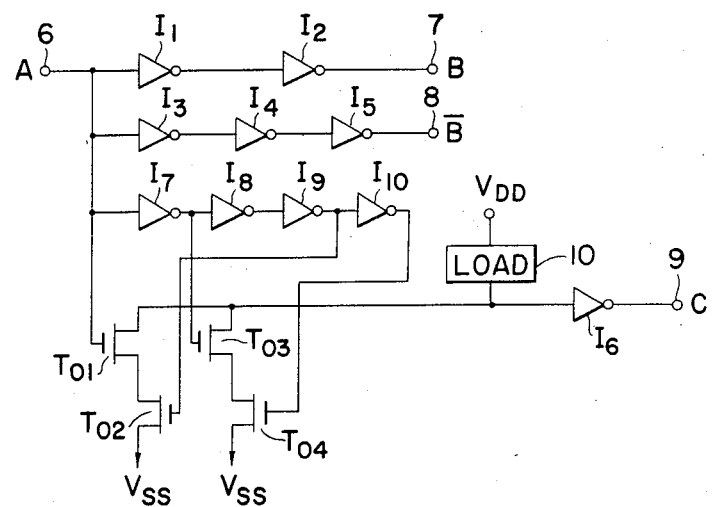

TRANSITION DETECTOR CIRCUIT

BACKGROUND OF THE INVENTION

The present invention relates to a MOS (MetalOxide-Silicon) integrated circuit provided on a semiconductor substrate, and more particularly to a transition detector circuit for sensing a change of an input signal of the MOS circuit, thereby producing pulse signals responsive thereto.

Heretofore, there have been proposed some conventional transition detector circuits. One is a circuit including a feedback network for effecting input control. The other is a circuit which does not include such a feedback network.

The problems with the transition detector circuit including a feedback network are that the circuit design thereof is complicated and there occurs undesirable time delays in the operation thereof.

On the other hand, the transition detector circuit without a feedback network is preferable in that the circuit design is simple and operates at a high speed. However, it happens that this circuit operates erroneously due to the difference of operation timing of each circuit component, when input signals vary slowly.

SUMMARY OF THE INVENTION

With the above in mind, an object of the present invention is to provide a transition detector circuit making it possible to operate at a high speed with a simplified circuit construction and to effect a normal operation, even if there exists a limited timing relationship or timing limitation between an input signal and an output signal.

In order to achieve this object, according to the present invention, there is provided a transition detector circuit capable of producing output pulse signals each having a desired pulse width by means of a circuit which is simplified and operates at a high speed, in which a feedback network is eliminated and a plurality of invertor trains are provided, and capable of effecting a normal operation even if there exists a timing limitation between an input signal and an output signal on the basis of the circuit construction that an invertor or some invertors among invertors for limiting a pulse width of the output pulse is in common with respective invertor trains for producing in-phase and antiphase outputs and that a predetermined relationship holds between threshold levels of these invertors.

BRIEF DESCRIPTION OF THE DRAWINGS

FIGS. 1 and 2 are circuit diagrams illustrating prior art transition detectors, respectively;

PREFERRED EMBODIMENTS OF THE PRESENT INVENTION

Figure 3:
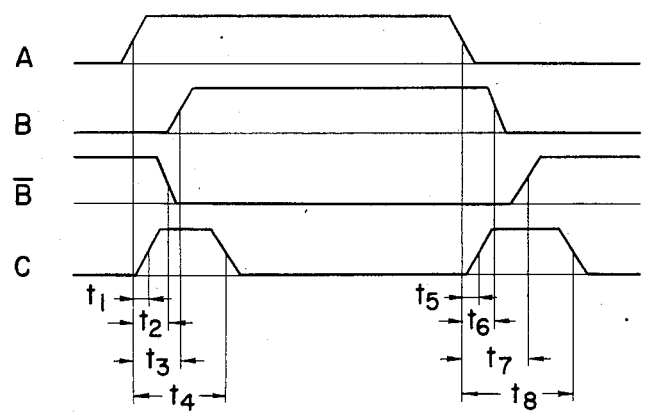
FIG. 3 is a timing chart for explaining a timing limitation between an input signal and an output signal of FIG. 2 circuit.

Prior to the description of the invention, reference will be first made to the conventional transition detectors in conjunction with FIGS. 1 to 3. Thereafter, the preferred embodiments of a transition detector circuit according to the present invention will be referred to in conjunction with FIGS. 4 to 7.

The prior art transition detector in a MOS integrated circuit is now described with reference to FIGS. 1 to 3.

FIG. 1 shows an example of circuit of a conventional device, as shown in U.S. Pat. No. 4,039,858. An output signal 1 of the transition detector is utilized in order to effect input control for an input signal 2. The transition detector is designed so as to produce pulse signals at an output terminal 3 with the feedback looped network thus formed. However, since the circuit construction shown in FIG. 1 requires the feedback network, its circuit design becomes complicated. Further, with this circuit, output signals 4 and 5 except for pulse signals are output through a transfer gate controlled by the pulse signal 1, thereby resulting in large time delays.

FIG. 2 is a circuit diagram illustrating another conventional device. A feature of this embodiment is that the feedback network as employed in FIG. 1 circuit is not used, and time interval adjustment is effected depending on the stage number of an invertor train. Between a signal input terminal 6 and an in-phase output terminal 7, there is provided an invertor train comprising an even number of invertor $I_1$ and $I_2$. On the other hand, between the input terminal 6 and an antiphase (180° out-of-phase) output terminal 8, there is provided an invertor train comprising an odd or uneven number of invertors $I_3$, $I_4$ and $I_5$. A first pair of Field Effect Transistors (which will be called "transistors" hereinafter) $T_{01}$ and $T_{02}$ connected in series, and a second pair of transistors $T_{03}$ and $T_{04}$ connected in series are connected to one reference power supply $V_{SS}$, respectively. These pairs of transistors are further connected commonly to a pulse output terminal 9 through an invertor $I_6$. Another reference power supply $V_{DD}$ is connected to the input of the invertor $I_6$ through a load 10. Further, an invertor train comprising $I_7$, $I_8$, $I_9$ and $I_{10}$ is connected to the signal input terminal 6. The outputs of invertors $I_7$, $I_9$ and $I_{10}$ are fed to the gate terminals of transistors $T_{03}$, $T_{02}$ and $T_{04}$, respectively. Further, a signal being propagated from the signal input terminal 6 is supplied to the gate terminal of the transistor $T_{01}$.

With the circuit construction shown in FIG. 2, a time interval of the pulse output C is determined due to signal delays occurring when the signal input A is propagated through three stages of invertors comprising either of invertors $I_7$, $I_8$ and $I_9$ and invertors $I_8$, $I_9$ and $I_{10}$ with respect to a change of the signal input A. As a result, this makes it possible to effect an adjustment of the time interval depending on the stage number of the invertor train, thereby making it easy to design the circuit. Further, signal propagating routes for the in-phase output B and the antiphase output $\bar{B}$ are different from that of the pulse output C. Consequently, this ensures that the circuit operates at a high speed.

However, as described above, in regard to the circuit construction shown in FIG. 2, the signal paths for the in-phase output B and the antiphase output $\bar{B}$ are different from that of the pulse output C. Accordingly, the circuit of FIG. 2 cannot properly operate when the following relationship is required in connection with the timing relationship between the in-phase and antiphase outputs B and $\bar{B}$ and the pulse output C. The reason therefore will be described with reference to FIG. 3.

As shown in FIG. 3, suppose the relationship in connection with time is as follows: It is to be noted that "H"

or "L" showing a logical level is referred to in terms of usual logical expression. The designation $t_1$ denotes a time interval from a time when the signal input A changes from "L" to "H" to a time when the pulse output C rises, $t_2$ a time interval from the same time to a time when the antiphase output $\bar{B}$ changes to "L", $t_3$ a time interval from the same time to a time when the in-phase output B changes to "H", and $t_4$ a time interval from the same time to a time when the pulse output C falls. Likewise, $t_5$ denotes a time interval from a time when the signal input A changes from "H" to "L" to a time when the pulse output C rises, $t_6$ a time interval from the same time to a time when the in-phase output B changes to "L", $t_7$ a time interval from the same time to a time when the antiphase output $\bar{B}$ changes to "H", and $t_8$ a time interval from the same time to a time when the pulse output C falls. Further, suppose that the threshold voltages of invertors $I_1$, $I_3$ and $I_7$ and the transistor $T_{01}$ are $V_1$, $V_3$, $V_7$ and $V_{01}$, respectively. In this instance, when an inequality $t_1<t_2<t_3<t_4$ and an inequality $t_5<t_6<t_7<t_8$ must hold, an inequality $V_{01}<V_1<V_7$ is required from the former ($t_1<t_2<t_3<t_4$), and an inequality $V_3<V_7$ and an inequality (the time delay of invertors $I_3$ to $I_5$)<(the time delay of invertors $I_7$ to $I_{10}$) are required from the latter ($t_5<t_6<t_7<t_8$).

Assume now that the signal input A varies slowly from "H" to "L". Since the output of the invertor $I_7$ changes and then the output of the invertor I3 changes, the relationship $t_5<t_6$ is satisfied. However, in this instance, care must be taken. When the signal input A slowly changes and reaches the threshold level of the invertor $I_7$. After the change of the output of the invertor $I_7$ is propagated to the invertor $I_{10}$, the signal input A reaches the threshold level of the invertor $I_3$. Taking into account these conditions, the information in connection with the output change of the invertor $I_7$ is propagated to the invertor $I_{10}$. As a result, after the pulse output C has fallen, the output of the invertor $I_3$ changes. Consequently, the relationship $t_7<t_8$ cannot be satisfied.

Figure 4:
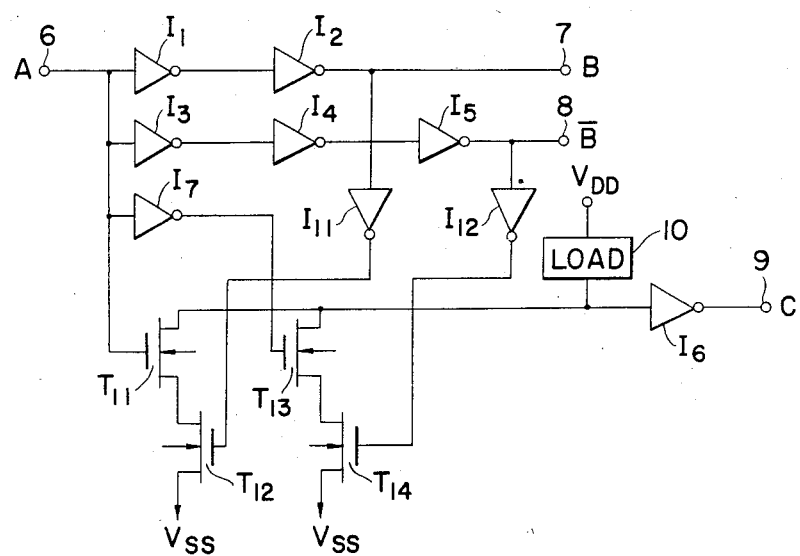
FIG. 4 is a circuit diagram illustrating an embodiment of the present invention.

The preferred embodiments according to the invention is now described with reference to FIGS. 4 to 7. FIG. 4 shows a circuit diagram illustrating an embodiment of the invention wherein like components in FIG. 2 are designated by like reference numerals. The inphase output being propagated from the invertor $I_2$ is fed to the gate of an n-channel transistor $T_{12}$ through the invertor $I_{11}$. The antiphase output being propagated from the invertor $I_5$ is fed to the gate of an n-channel transistor $T_{14}$ through the invertor $I_{12}$. The signal input A is fed to the gate of an n-channel transistor $T_{11}$, and is also fed to an n-channel transistor $T_{13}$ through the invertor $I_7$, respectively. The capacity of each invertor serving as a driver and the load 10 is determined so that the relationship $V_7>V_1>V_3V_{11}$ holds between the threshold voltages $V_1$, $V_3$ and $V_7$ of invertors $I_1$, $I_3$ and $I_7$ and the threshold voltage $V_{11}$ of the transistor $T_{11}$. In order to obtain the relationship in regard to such threshold voltages, the dimension of the p-channel and n-channel of the transistors constituting invertors and that of transistors constituting a switching circuit are determined.

Figure 5:
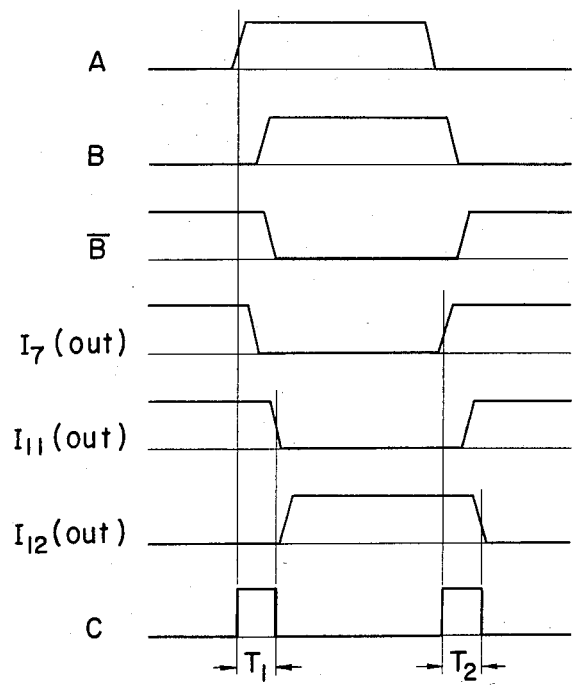
FIGS. 5 and 6 are timing charts showing operations of the FIG. 4 circuit, respectively.

The operation when the signal input A changes to "L" for a second time after the signal input A changes from "L" to "H" in FIG. 4 circuit will be described with reference to FIG. 5.

When the signal input A is "L", outputs of invertors $I_7$ and $I_{11}$ or "H", and the output of inverter $I_{12}$ is "L". Accordingly, transistors $T_{11}$, $T_{12}$, $T_{13}$ and $T_{14}$ are placed in OFF, ON, ON and OFF states, respectively. As a result, the pulse output C is "L".

On the contrary, when the signal input A is changed to "H", the transistor $T_{11}$ turns on. As a result, the pulse output C changes from "L" to "H". Further, after the delay time $T_1$ determined by the invertors $I_1$, $I_2$ and $I_{11}$ is passed, the output of the invertor $I_{11}$ changes from "H" to "L". As a result, since the transistor $T_{12}$ turns off, the pulse output C is returned to "L" from "H". Thus, a pulse having a time interval ($T_1$) determined by invertors $I_1$, $I_2$ and $I_{11}$ is output from the terminal 9.

Further, when the signal input A changes from "H" to "L", the invertor $I_7$ changes from "L" to "H" in a predetermined time delay inherent in the invertor $I_7$, with the result that the transistor $T_{13}$ turns on. As a result, the output C changes from "L" to "H". Further, after the delay time determined by invertors $I_3$, $I_4$, $I_5$ and $I_{12}$ is passed, the output of the invertor $I_{12}$ changes from "H" to "L", with the result that the transistor $T_{14}$ turns off. As a result, the pulse output C changes from "H" to "L". Thus, a pulse having a time interval ($T_2$) determined by invertors $I_7$, $I_3$, $I_4$, $I_5$ and $I_{12}$ is output from the terminal 9.

As stated above, a pulse width of the pulse output C is determined by the delay time of each invertor. Accordingly, it is possible to set the desired value of the pulse widths $T_1$ and $T_2$ by increasing or decreasing the stage number of the invertor, or changing the delay time thereof.

Figure 6:
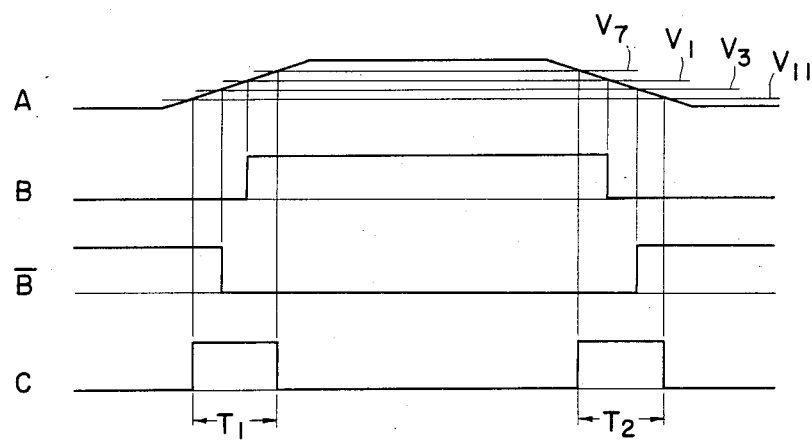

The operation will be described with reference to FIG. 6 when the signal input A varies slowly from "L" to "H", and then varies slowly from "H" to "L" for a second time. In this instance, the above-described relationship $V_7>V_1>V_3>V_{11}$ holds in connection with the respective threshold voltages $V_7$, $V_1$, $V_3$ and $V_{11}$ of invertors $I_7$, $I_1$ and $I_3$, and the transistor $T_{11}$.

When the signal input A approaches gradually from "L" to "H", and then reaches the level of $V_{11}$, the transistor $T_{11}$ turns on and the pulse output C changes from "L" to "H".

When the signal input A further approaches "H" and then reaches the level of $V_3$, the output of the invertor $I_3$ becomes "L". Accordingly, the antiphase output $\bar{B}$ becomes "L" in a predetermined time delay determined by invertors $I_4$ and $I_5$. Further, since the output of the invertor $I_{12}$ becomes "H", the transistor $T_{14}$ turns on.

When the signal input A further approaches "H" and then reaches the level of $V_1$, the output of the invertor $I_1$ becomes "L". Accordingly, the in-phase output B becomes "H" in a predetermined time delay of the invertor $I_2$. Further, since the output of the invertor $I_{11}$ becomes "L", the transistor $T_{12}$ turns off. However, since transistors $T_{13}$ and $T_{14}$ have already turned on, the pulse output C is maintained "H".

When the signal input A further approaches "H" and then reaches the level of $V_7$, the output of the invertor $I_7$ becomes "L", with the result that the transistor $T_{13}$ turns off. As a result, the pulse output C becomes "L". Thus, a pulse having a time interval $T_1$ is obtained.

Then, after a predetermined time is passed, when the signal input A approaches from "H" gradually to "L" and then reaches the level of $V_7$, the output of the invertor $I_7$ is inverted into "H". Accordingly, the transistor $T_{13}$ turns on, with the result that the pulse output C becomes "H".

When the signal input A further approaches "L" and then reaches the level of $V_1$, the output of the invertor $I_1$ becomes "H" while the output of the in-phase output B becomes "L". Since the invertor $I_{11}$ becomes "H", the transistor $T_{12}$ turns on.

When the signal input A further approaches "L" to reach the level of $V_3$, the output of the invertor $I_3$ becomes "H". As a result, the antiphase output $\overline{B}$ becomes "H". Since the output of the invertor $I_{12}$ becomes "L", the transistor $T_{14}$ turns off. However, since transistors $T_{11}$ and $T_{12}$ are maintained on, the pulse output C is also maintained "H".

Finally, when the signal input A further approaches "L" to reach the level of $V_{11}$, the transistor $T_{11}$ turns off. As a result, the pulse output C becomes "L". Thus, a pulse having a time interval $T_2$ is obtained.

Figure 7:
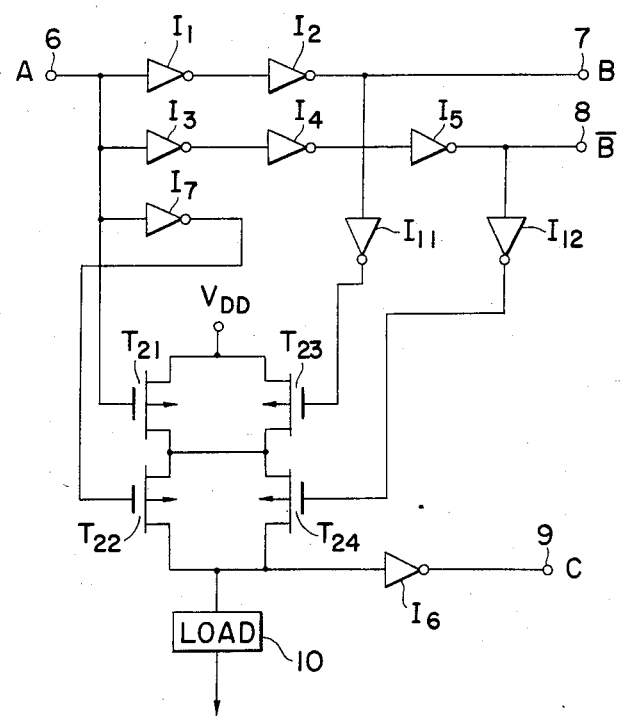
FIG. 7 is a circuit diagram illustrating another embodiment of the invention.

Referring to FIG. 7, there is shown another embodiment of the invention, wherein like components in FIG. 4 are designated by like reference numerals. A p-channel transistor $T_{21}$ and a p-channel transistor $T_{23}$ are connected in parallel. A p-channel transistor $T_{22}$ and a p-channel transistor $T_{24}$ are also connected in parallel. These parallelly-connected pairs are connected in series. The signal input A is fed to the gate of the transistor $T_{21}$. The outputs of invertors $I_7$, $I_{11}$ and $I_{12}$ are fed to gates of transistors $T_{22}$, $T_{23}$ and $T_{24}$, respectively.

The threshold levels $V_1$, $V_3$ and $V_7$ of invertors $I_1$, $I_3$ and $I_7$ and the threshold level $V_{21}$ of the transistor $T_{21}$ are determined such that the relationship $V_{21} < V_3 < V_1 < V_7$ holds. This is accomplished by changing the channel dimension of the transistor, as stated above. Thus, the circuit shown in FIG. 7 normally operates when there exists a timing limitation as shown in FIG. 3 in connection with input and output signals.

As is apparent from the foregoing description, according to the present invention, the feedback network as employed in the prior art device is not used, and a pulse width is determined based on invertor trains. Accordingly, this makes it possible to embody a transition detector which is easy to design and which operates at a high speed. Further, the transition detector of the invention determines a pulse width of the pulse being output on the basis of the delay time of an invertor. Accordingly, this makes it possible to adjust a pulse width and to stabilize the pulse width as desired.

Further, according to the present invention, invertors for limiting a pulse width form a part of invertors for obtaining the in-phase and antiphase outputs. A predetermined relationship is given between the threshold levels of invertors and switching elements (for example, transistor) constituting the switching circuit. Thus, it is possible to obtain the transition detector circuit which operates desirably, even if there exists a timing limit as shown in FIG. 3 between input and output signals.

What is claimed is:
1. A transition detector circuit comprising:
   (a) a first invertor train comprising 2n stages of invertors (n: positive integer including zero), the input thereof being connected to a signal input terminal while the output thereof is connected to an in-phase output terminal;
   (b) a second invertor train comprising 2n+1 stages of invertors, the input thereof being connected to said signal input terminal, while the output thereof is connected to an antiphase output terminal;
   (c) a third invertor train, comprising at least one stage of an invertor, connected to the output of said first invertor train;
   (d) a fourth invertor train, comprising at least one stage of an invertor, connected to the output of said second invertor train;
   (e) a fifth invertor train, comprising at least one stage of an invertor, connected to said signal input terminal;
   (f) a first switching circuit which turns on or off in response to a signal fed from said signal input terminal and turns off or on in response to a signal fed from said third invertor train to produce a pulse signal having a first delay time determined by said first and third invertor trains; and
   (g) a second switching circuit which turns on or off in response to a signal fed from said fourth invertor train and turns off or on in response to a signal fed from said fifth invertor train to produce a pulse signal having a second delay time determined by said second, fourth and fifth invertor trains.

2. A transition detector circuit as defined in claim 1, wherein the following relationship holds $$V_3 > V_1 > V_2 > V_4,$$

where $V_1$ denotes a threshold voltage of a first stage of an invertor of said first invertor train, $V_2$ a threshold voltage of a first stage of an invertor of said second invertor train, $V_3$ a threshold voltage of a first stage of said fifth invertor train, and $V_4$ a voltage at a time when said first switching circuit turns on or off in response to a signal fed from said signal input terminal.

3. A transition detector circuit as defined in claim 2, wherein the relationship in connection with the threshold voltages is formed by suitably selecting the dimension of channels of transistor constituting each of said invertors and said switching circuits.

* * * * *